(12) United States Patent
Hashidate et al.

(10) Patent No.: US 6,441,665 B1
(45) Date of Patent: Aug. 27, 2002

(54) SEMICONDUCTOR INTEGRATED CIRCUIT

(75) Inventors: Shuichi Hashidate; Shinichi Fukuzako; Tetsuya Tanabe, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/592,261

(22) Filed: Jun. 12, 2000

(30) Foreign Application Priority Data

Nov. 25, 1999 (JP) .......................................... 11-334078

(51) Int. Cl.[7] .............................................. H03H 11/26
(52) U.S. Cl. ........................................ 327/270; 327/161
(58) Field of Search ................................ 327/161, 271, 327/270, 276, 277, 278, 281, 283; 713/600, 400

(56) References Cited

U.S. PATENT DOCUMENTS

| | | | | |
|---|---|---|---|---|
| 5,673,005 A | * | 9/1997 | Pricer ......................... | 327/284 |
| 5,986,830 A | * | 11/1999 | Hein .......................... | 375/285 |
| 6,247,138 B1 | * | 6/2001 | Tamura et al. ............... | 713/600 |

FOREIGN PATENT DOCUMENTS

| | | | | |
|---|---|---|---|---|
| JP | 401320816 A | * | 12/1989 | ................. 327/283 |
| JP | 405136664 A | * | 6/1993 | ................. 327/261 |
| JP | 10-228449 | | 8/1998 | |

\* cited by examiner

*Primary Examiner*—Timothy P. Callahan
*Assistant Examiner*—Linh Nguyen
(74) *Attorney, Agent, or Firm*—Volentine Francos, PLLC

(57) ABSTRACT

A semiconductor integrated circuit is provided that achieves a lesser degree of inconsistency in the delay time of clock signals that are internally provided. An input clock signal distributed via an input clock supply path is provided to individual timing adjustments circuits. The timing adjustment circuits are each constituted by providing a wiring pattern having serial resistors and gaps in a circuit correction area. The wiring pattern of the semiconductor integrated circuit is corrected by employing a focused ion beam apparatus to achieve an adjustment so that internal input clock signals at the same phase are obtained from the individual timing adjustment circuits. Using the wiring pattern having undergone the adjustment, a semiconductor integrated circuit is manufactured as a product.

14 Claims, 10 Drawing Sheets

36d

36d

SEMICONDUCTOR INTEGRATED CIRCUIT

BACKGROUND OF THE INVENTION

1. Field of the Invention

The present invention relates to a semiconductor integrated circuit, and more specifically, it relates to a clock supply technology employed to provide clock signals at the same phase to input/output circuits provided in the semiconductor integrated circuit.

2. Description of the Related Art

In parallel data transfer implemented between a plurality of semiconductor integrated circuits, data are normally input/output in synchronization with a reference clock signal. For instance, when inputting data in synchronization with the rise of the clock signal from level "L" to level "H," the data to be transferred need to be sustained at a constant level over a specific length of time preceding and following the rise of the clock signal in order to transfer the data without error and with a high degree of reliability. The specific length of time elapsing before the rise is referred to as the setup time, whereas the specific length of time elapsing after the rise is referred to as the hold time.

As semiconductor integrated circuit technology has become more advanced, both the setup time and the hold time have been reduced to achieve a reduction in the length of time required for data transfer. However, unless clock signals achieving the same phase are provided to the input/output circuits utilized for data input/output, any reduction in the length of time required for data transfer is not achieved through reductions in the setup time and the hold time, in parallel data transfer. In other words, if the phases of clock signals provided to the individual input/output circuits are inconsistent, the actual data transfer cycle must be set by taking into consideration the inconsistency and, as a result, the length of time of data transfer increases.

At the same time, as the scale of integrated circuits is becoming larger, the routing through which clock signals are provided to the input/output circuits utilized for data input/output is becoming longer and more complex. In order to provide the clock signals to the individual input/output circuits while achieving uniform phase, methods such as devising a circuit arrangement that will equalize the lengths of supply routes and inserting a specific type of delay circuit in the clock supply route as necessary have been adopted in the prior art.

For instance, FIG. 2 is a block diagram of the semiconductor integrated circuit in the prior art which is disclosed in Japanese Unexamined Patent Publication No. 1998-228449.

This semiconductor integrated circuit comprises a drive-side semiconductor device 10 that outputs data and a reception-side semiconductor device 20 that receives the data.

The drive-side semiconductor device 10 is provided with a clock source 11 and a shift clock generating circuit. The clock source 11 generates a clock signal CLK. The shift clock generating circuit 12 generates a shift clock signal SCK achieved by shifting the phase of the clock signal CLK by a specific degree. The clock signal CLK and the shift clock signal SCK are provided to a switch 13 where either one of the signals is selected a mode signal MOD provided from the outside.

The drive-side semiconductor device 10 is also provided with an internal logic circuit 14 and a dummy output generating circuit 15. The internal logic circuit 14 generates output data. The dummy output generating circuit 15 generates dummy data to be used for adjustment. The output sides of the internal logic circuit 14 and the dummy output generating circuit 15 are connected to the input side of a switch 16 controlled by the mode signal MOD. The output side of the switch 16 is connected to the input sides of output circuits 17-0~17-n, utilized to output in parallel data with a plurality of bits to the reception-side semiconductor device 20. The output circuits 17-0~17-n, output data in synchronization with the clock signal CLK or the shift clock signal SCK selected at the switch 13.

The reception-side semiconductor device 20 is provided with a clock input circuit 21 and input circuits 22-0~22-n. The clock signal CLK from the drive-side semiconductor device 10 is provided to the clock input circuit 21, and the data with a plurality of bits are provided in parallel to the input circuits 22-0~22-n. The clock input circuit 21 generates and provides an internal clock signal ICK required in the reception-side semiconductor device 20 by using the clock signal CLK. The internal clock signal ICK is provided to timing adjustment circuits 24-0~24-n via a clock supply route 23. The individual timing adjustment circuits 24-0~24-n are respectively provided adjacent to the input circuits 22-0~22-n, and are utilized to provide the internal clock signal ICK to the individual input circuits 22-0~22-n, with almost the same timing by correcting differences in the length of transmission delay of the internal clock signal ICK occurring in the clock supply route 23. The timing adjustment circuits 24-0~24-n are each provided with a delay circuit that divides one cycle of the internal clock signal ICK into a plurality of equal portions, and the internal clocks ICK delayed by the individual delay circuits are sequentially selected to be provided to the corresponding input circuits 22-0~22-n.

In this type of semiconductor integrated circuit, the mode signal MOD is set to an adjustment mode over a specific length of time in elapsing, for instance, immediately after a power-up. This results in the shift clock signal SCK being selected at the switch 13 of the drive-side semiconductor device 10 and the dummy output generating circuit 15 being selected at the switch 16. As a result, dummy data for adjustment are output by the output circuits 17-0~17-n in synchronization with a rise of the shift clock signal SCK.

At the clock input circuit 21 of the reception-side semiconductor device 20, the internal clock signal ICK is generated based upon the clock signal CLK provided by the drive-side semiconductor device 10 and the internal clock signal ICK is provided to the timing adjustment circuits 24-0~24-n via the clock supply route 23. At the individual timing adjustment circuits 24-0~-24-n, clock signals for timing adjustment output by the delay circuits are sequentially selected and provided to the corresponding input circuits 22-0~22-n. Then, when the dummy data for adjustment provided by the output circuits 17-0~17-n at the drive-side semiconductor device 10 have been input in a normal state, the timing of the clock signals output by the individual timing adjustment circuits 24-0~24-n become fixed, thereby completing the timing adjustment for the clock signals.

When the specific length of time has elapsed after a power-up, the mode signal MOD is set in normal mode, thereby selecting the clock signal CLK at the switch 13 and selecting the internal logic circuit 14 at the switch 16 in the drive-side semiconductor device 10. Thus, a normal operation starts in which data generated at the internal logic circuit 14 are output through the output circuits 17-0~17-n in synchronization with a rise of the clock signal CLK.

At the individual input circuits 22-0~22-n at the reception-side semiconductor device 20, data input is performed in conformance to the clock signals provided by the individual timing adjustment circuits 24-0~24-n having undergone adjustment.

However, the following problems have yet to be addressed in the semiconductor integrated circuit in the prior art.

Namely, the timing adjustment processing must always be performed over a specific period of time after power-up by setting the adjustment mode with the mode signal MOD, and thus, normal operation cannot be started for the specific length of time. In addition, it is necessary to implement control for performing the adjustment processing, which complicates the structure of the control circuit.

SUMMARY OF THE INVENTION

An object of the present invention is to provide a semiconductor integrated circuit that achieves a reduction in the degree of inconsistency among delays by addressing the problems of the prior art discussed above and setting the delays at the individual delay circuits based upon transmission delay times that are actually measured.

In order to achieve the object described above, the semiconductor integrated circuit according to a first invention comprises a plurality of input terminals to which input data with a plurality of bits are provided in parallel with uniform timing, an input clock terminal to which an input clock signal indicating the timing for input data is provided, a plurality of means for input, each connected to one of the plurality of input terminals, to hold the input data provided to the corresponding input terminal with the timing of a rise or a fall of an internal input clock signal, a means for input clock distribution provided to distribute the input clock signal provided to the input clock terminal to the plurality of means for input and a plurality of adjustable means for input clock supply each provided between the means for input clock distribution and one of the means for input, that are utilized to generate internal input clock signals with uniform timing in synchronization with the input data to be provided to the individual means for input correcting differences in the length of delay of the input clock signals occurring in different distribution routes at the means for input clock distribution through connection/disconnection of elements inserted in series or in parallel.

The following advantage is achieved by assuming this structure.

The input clock signal provided to the input clock terminal is transmitted to the individual means for input clock supply via the means for input clock distribution. At the individual means for input clock supply to which the input clock signal is transmitted through different distribution routes at the means for input clock distribution with varying lengths of delay, the differences in the delay time are corrected and internal input clock signals achieving uniform timing are generated to be provided to the corresponding means for input. The input data with a plurality of bits are provided to the input terminals with uniform timing and then are input to the means for input connected to the input terminals. The input data are held with uniform timing at the means for input in conformance to the internal input clock signals.

In a second invention, the means for input clock supply according to the first invention are each provided with a circuit correction area where serial resistors can be inserted or shorted, parallel capacitors can be connected or disconnected or drive transistors can be connected or disconnected by correcting the circuit pattern utilizing a circuit correction device provided to correct an integrated circuit formed on a semiconductor substrate.

By adopting this structure, the following advantage is achieved at each means for input clock supply.

The delay time of the input clock signal transmitted to each means for input clock supply via the means for input clock distribution is corrected by the serial resistors, the parallel capacitors or the drive transistors in the circuit correction area, and the corrected input clock signal is provided to the corresponding means for input.

In a third invention, the means for input clock supply are each provided with an inversion amplifier unit that outputs a signal achieved by inverting the input clock signal provided by the means for input clock distribution, a first transistor connected between a source potential and a source terminal of the inversion amplifier unit, which supplies power to the inversion amplifier unit, a second transistor and a third transistor connected between the source potential and the source terminal of the inversion amplifier unit, the power supply by which the inversion amplifier unit is controlled in conformance with a first control signal and a second control signal respectively, a fourth transistor, a fifth transistor and a sixth transistor, a first control unit and a second control unit that are to be detailed below.

The fourth transistor, which is connected between a ground potential and a ground terminal of the inversion amplifier unit, supplies power to the inversion amplifier unit. The fifth and sixth transistors are connected between the ground potential and the ground terminal of the inversion amplifier unit, and the power supply to the inversion amplifier unit is controlled in conformance to a third control signal and a fourth control signal respectively. The first control unit, which is provided with a first fuse, implements control on the second and fifth transistors so as to sustain them in an ON state when the first fuse is not disconnected and outputs the first and third control signals to implement control on the second and fifth transistors so as to set them in an OFF state when the first fuse is disconnected. The second control unit, which is provided with a second fuse, implements control on the third and sixth transistors so as to sustain them in an OFF state when the second fuse is not disconnected and outputs the second and fourth control signals to implement control on the third and sixth transistors so as to set them in an ON state when the second fuse is disconnected.

In the third invention, the individual means for input clock supply function as follows.

The input clock signal transmitted via the means for input clock distribution to each means for input clock supply is inverted and amplified at the inversion amplifier unit which is connected to the source potential via the first through third transistors and connected to the ground potential via the fourth through sixth transistors to receive power. At this time, if the first fuse at the first control unit is not disconnected, the second and fifth transistors enter an ON state to supply power to the inversion amplifier unit together with the first and fourth transistors. If, on the other hand, the first fuse is disconnected, the second and fifth transistors are set in an OFF state and are cut off from the power supply. If the second fuse at the second control unit is not disconnected, the third and the sixth transistors enter an OFF state to become cut off from the power supply. If the second fuse is disconnected, the third and sixth transistors are set in an ON state to supply power to the inversion amplifier unit to together with the first and fourth transistors.

The semiconductor integrated circuit according to a fourth invention comprises a plurality of input terminals, an input clock terminal, a plurality of means for input, a means for input clock distribution, a plurality of means for input clock supply each provided between the means for input clock distribution and one of the means for input to generate an internal input clock signal based upon the input clock signal distributed by the means for input clock distribution to be provided to the corresponding means for input, and a plurality of output terminals, an output clock terminal, a plurality of means for output, a means for output clock distribution, a plurality of means for output clock supply and a means for data loop-back all of which are to be detailed below.

The output terminals output in parallel output data with a plurality of bits. An output clock signal indicating the timing with which the output data are output is provided to the output clock terminal. The means for output are each connected to one of the plurality of output terminals to output the output data to the corresponding output terminals in conformance to an internal output clock signal. The means for output clock distribution distributes the output clock signal provided to the output clock terminal to the plurality of means for output.

The means for output clock distribution distributes the output clock signal provided to the output clock terminal to the plurality of means for output. The means for output clock supply, each provided between the means for output clock distribution and one of the means for output, generate internal output clock signals based upon the output clock signal distributed by the means for output clock distribution and provide them to the corresponding means for output. When a test mode is specified by a mode signal used to specify either the test mode or a normal mode, the means for data loop-back provides the input data held at the means for input to the means for output as output data.

In the circuit structured as described above, the following operation is performed.

When the test mode is specified with the mode signal, the means for data loop-back connects the output sides of the means for input to the input sides of the means for output. In addition, the input clock signal provided to the input clock terminal is communicated to the individual means for input clock supply via the means for input clock distribution.

At each means for input clock supply, to which the input clock signal has been transmitted, an internal input clock signal is generated using the input clock signal and the resulting internal input clock signal is provided to the corresponding means for input. The input data with a plurality of bits are provided to the input terminals with uniform timing and then are input to the means for input connected to the input terminals. Then, at the means for input the input data are held in synchronization with the internal input clock signals. The input data held at the means for input are provided to the means for output as output data via the means for data loop-back.

In addition, the output clock signal provided to the output clock terminal is communicated to the individual means for output clock supply via the means for output clock distribution. At each means for output clock supply, to which the output clock signal has been transmitted, an internal output clock signal is generated using the output clock signal and the resulting internal output clock signal is provided to the corresponding means for output. The output data with a plurality of bits provided to the means for output are output to the output terminals with uniform timing in synchronization with the internal output clock signals.

According to a fifth invention, the means for input clock supply in the fourth invention are each provided with a plurality of first delay elements that can be disconnected, to generate internal input clock signals achieving uniform timing in synchronization with the input data and to provide them to the corresponding means for input by correcting differences in the delay time of the input clock signal occurring in different distribution routes at the means for input clock distribution. In the semiconductor integrated circuit adopting the structure, the following operation is performed at each means for input clock supply in the fourth invention.

The difference in the delay time of the input clock signal provided via the means for input clock distribution occurring in the distribution route at the means for input clock distribution is corrected by the plurality of first delay elements that can be disconnected, and an internal input clock signal achieving uniform timing in synchronization with the input data is generated. The internal input clock signal thus generated is provided to the corresponding means for input.

According to a sixth invention, the means for input clock supply in the fifth invention are each provided with a first inversion amplifier unit that outputs a signal achieved by inverting the input clock signal provided by the means for input clock distribution via the first delay elements, a second inversion amplifier unit constituted of a pair of complementary conductive transistors, i.e., a first transistor and a second transistor that further inverts the output signal from the first inversion amplifier unit to generate an internal input clock signal, a single or a plurality of conductive third transistors identical to the first transistor that are connected in parallel to the first transistor and can be cut off through fuse disconnection and a single or a plurality of conductive fourth transistors identical to the second transistor that are connected in parallel to the second transistor and can be cut off through fuse disconnection.

In the semiconductor integrated circuit adopting the structure described above, the following operation is performed at each means for input clock supply.

The difference in the delay time of the input clock signal provided via the means for input clock distribution occurring in the distribution route at the means for input clock distribution is corrected by the plurality of disconnectable first delay elements. Then, at the first and second inversion amplifier units, the delay time is corrected and the waveform is shaped to generate the internal input clock signal achieving uniform timing in synchronization with the input data. The internal input clock signal thus generated is provided to the corresponding means for input.

According to a seventh invention, the means for output clock supply in the fourth invention are each provided with a plurality of second delay elements that can be disconnected, to generate internal output clock signals achieving uniform timing and to provide them to the corresponding means for output by correcting differences in the delay times of the output clock signal occurring in different distribution routes at the means for output clock distribution.

In the semiconductor integrated circuit adopting the structure, the following operation is performed at each means for output clock supply.

The difference in the delay time of the output clock signal provided via the means for output clock distribution occurring in the distribution route at the means for output clock distribution is corrected by the plurality of second delay elements that can be disconnected, and an internal output clock signal achieving uniform timing is generated. The internal output clock signal thus generated is provided to the corresponding means for output.

According to an eighth invention, the means for output clock supply in the seventh invention are each provided with a third inversion amplifier unit that outputs a signal achieved by inverting the output clock signal provided by the means for output clock distribution via the second delay elements, a fourth inversion amplifier unit constituted of a pair of complementary conductive transistors, i.e., a fifth transistor and a sixth transistor, that further inverts the output signal from the third inversion amplifier unit to generate an internal output clock signal, a single or a plurality of conductive seventh transistors identical to the fifth transistor that are connected in parallel to the fifth transistor and can be cut off through fuse disconnection and a single or a plurality of conductive eighth transistors identical to the sixth transistor that are connected in parallel to the sixth transistor and can be cut off through fuse disconnection. In the semiconductor integrated circuit adopting the structure described above, the following operation is performed at each means for output clock supply.

The difference in the delay time of the output clock signal provided via the means for output clock distribution occurring in the distribution route at the means for output clock distribution is corrected by the plurality of disconnectable second delay elements. Then, at the third and fourth inversion amplifier units, the delay time is corrected and the waveform is shaped to generate the internal output clock signal achieving uniform timing. The internal output clock signal thus generated is provided to the corresponding means for output.

According to a ninth invention, a first means of delay having a plurality of third delay elements, which can be adjusted through disconnection and are utilized to insert a constant phase delay, is provided between the input clock terminal and the means for input clock distribution in the fourth invention.

In this structure, after the input clock signal provided to the input clock terminal is delayed through the third delay elements, it is provided to the means for input clock distribution to be distributed to the individual means for input clock supply.

According to a tenth invention, the means for input clock supply in the ninth invention are each provided with a fifth inversion amplifier unit that outputs a signal achieved by inverting the input clock signal provided by the means for input clock distribution, a sixth inversion amplifier unit constituted of a pair of complementary conductive transistors, i.e., a ninth transistor and a tenth transistor that further inverts the output signal from the fifth inversion amplifier unit to generate an internal input clock signal, a single or a plurality of conductive eleventh transistors identical to the ninth transistor that are connected in parallel to the ninth transistor and can be cut off through fuse disconnection and a single or a plurality of conductive twelfth transistors identical to the tenth transistor that are connected in parallel to the tenth transistor and can be cut off through fuse disconnection.

In the semiconductor integrated circuit adopting this structure, the following operation is performed.

The waveform of the input clock signal provided by the means for input clock distribution is shaped and its delay time is adjusted by the fifth and sixth inversion amplifier units and the resulting signal is provided to the corresponding means for input as an internal input clock signal.

According to an eleventh invention, a second means of delay having a plurality of fourth delay elements, which can be adjusted through disconnection and are utilized to insert a constant phase delay, is provided between the output clock terminal and the means for output clock distribution in the fourth invention.

In this structure, after the output clock signal provided to the output clock terminal is delayed through the fourth delay elements, it is provided to the means for output clock distribution to be distributed to the individual means for output clock supply.

According to a twelfth invention, the means for output clock supply in the eleventh invention are each provided with a seventh inversion amplifier unit that outputs a signal achieved by inverting the output clock signal provided by the means for output clock distribution, an eighth inversion amplifier unit constituted of a pair of complementary conductive transistors, i.e., a thirteenth transistor and a fourteenth transistor that further inverts the output signal from the seventh inversion amplifier unit to generate an internal output clock signal, a single or a plurality of conductive fifteenth transistors identical to the thirteenth transistor that are connected in parallel to the thirteenth transistor and can be cut off through fuse disconnection and a single or a plurality of conductive sixteenth transistors identical to the fourteenth transistor that are connected in parallel to the fourteenth transistor and can be cut off through fuse disconnection.

In the semiconductor integrated circuit adopting this structure, the following operation is performed.

The waveform of the output clock signal provided by the means for output clock distribution is shaped and its delay time is adjusted by the seventh and eighth inversion amplifier units and the resulting signal is provided to the corresponding means for output as an internal output clock signal.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

First Embodiment

Figure 1A:
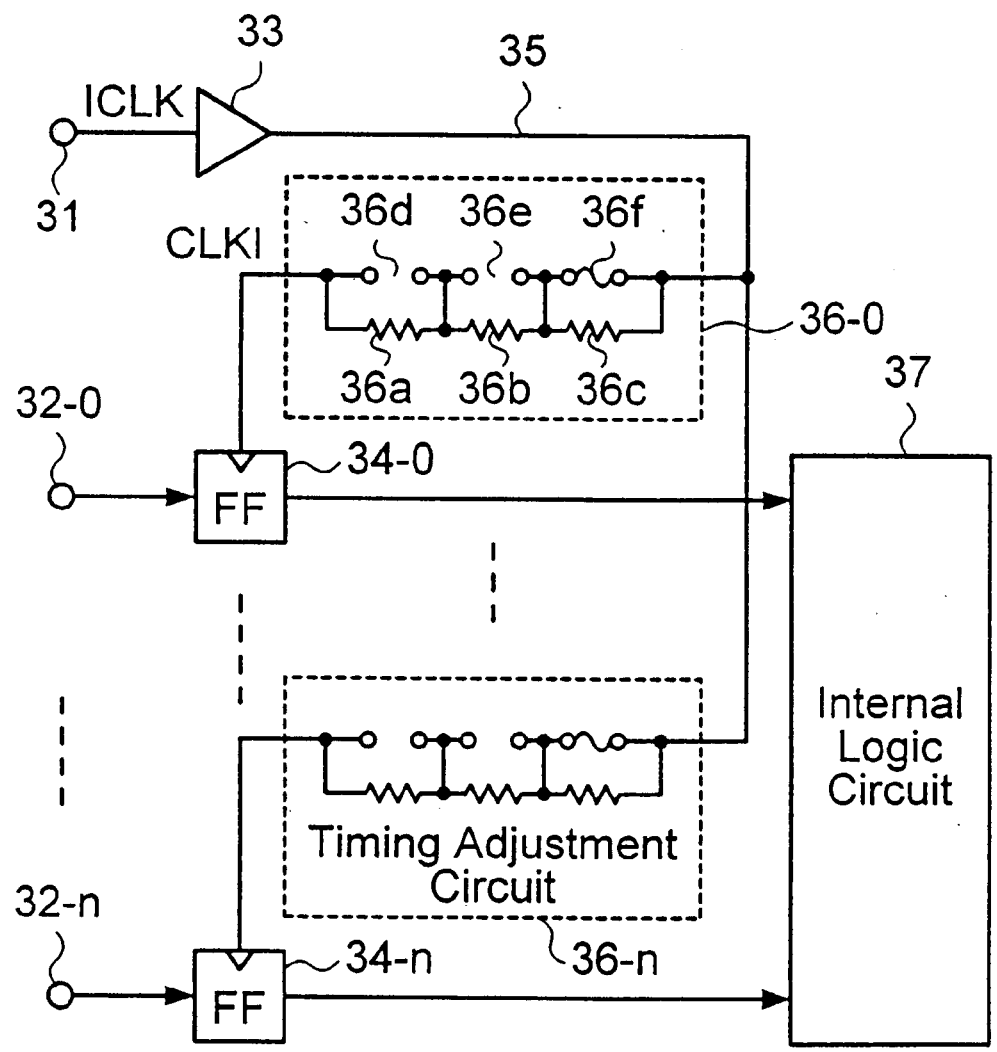
"FIGS. 1(a)–1(c) are diagrams of the semiconductor integrated circuit in a first embodiment of the present invention;"
Figure 1B:
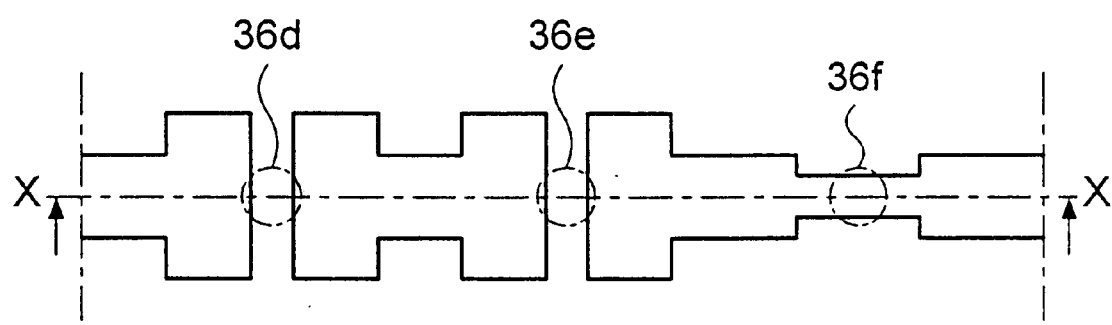
Figure 1C:
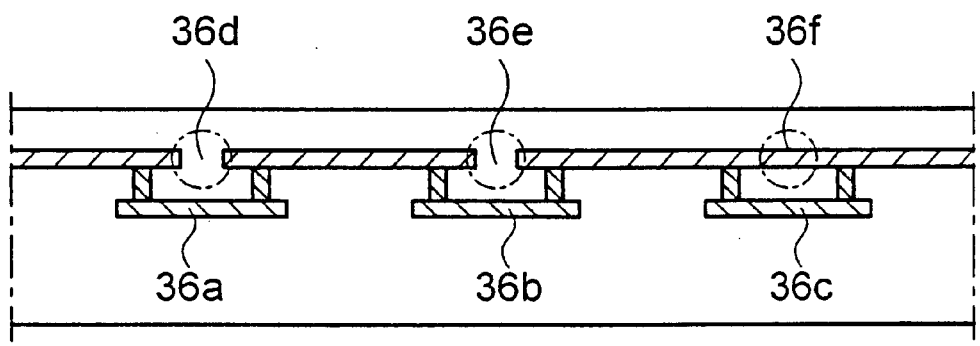
Figure 2:
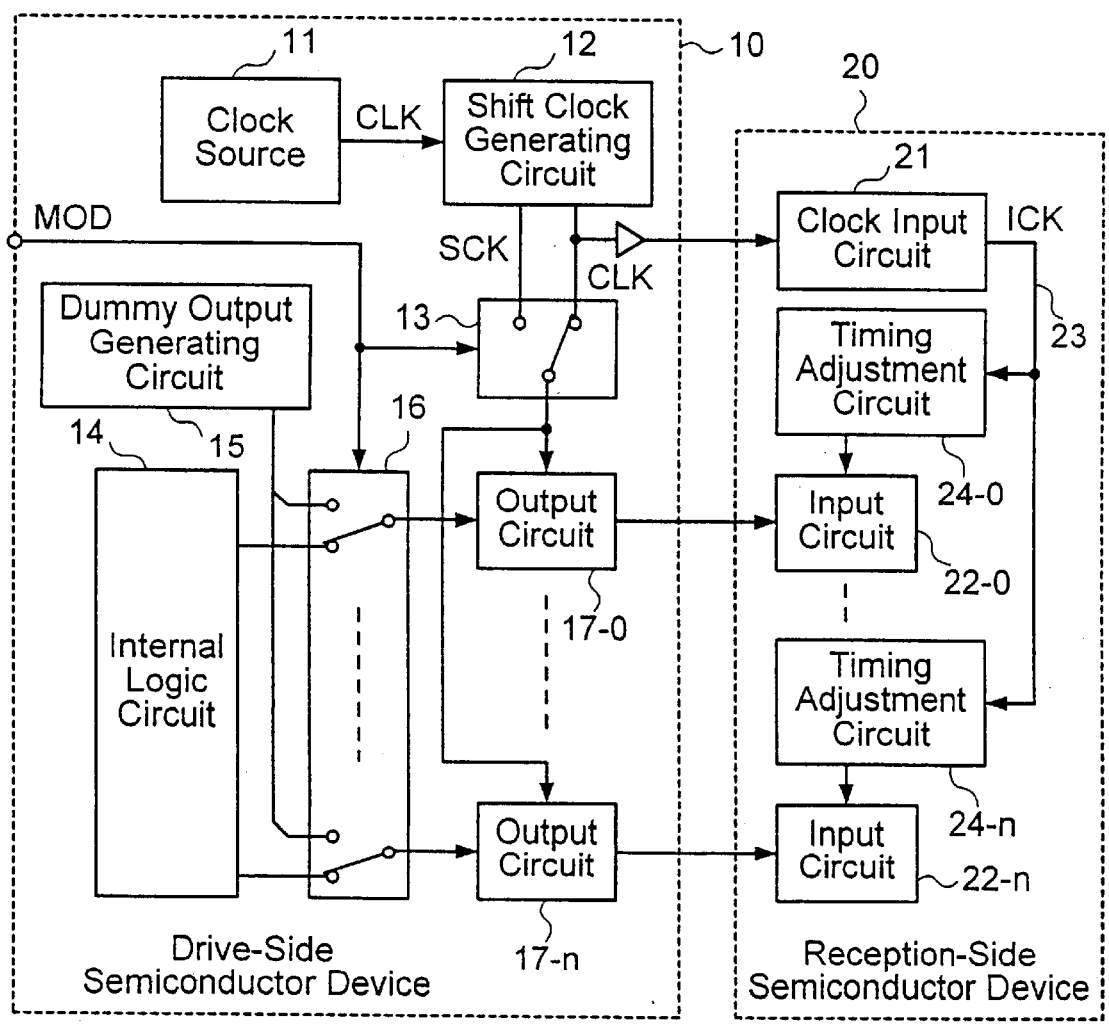
FIG. 2 is a block diagram of the semiconductor integrated circuit in the prior art.

FIGS. 1(a)~(c) are block diagrams of the semiconductor integrated circuit in the first embodiment of the present invention, with FIG. 1(a) illustrating the circuit structure, FIG. 1(b) presenting a plane view of the pattern at a timing adjustment circuit in the semiconductor integrated circuit in FIG. 1(a) and FIG. 1(c) presenting a sectional view through X—X in FIG. 1(b).

The following is an explanation of the structure (i), the development process (ii) and the operation (iii) of the semiconductor integrated circuit.

(i) Structure

"As shown in FIG. 1 (a), the semiconductor integrated circuit is provided with an input clock terminal 31 and input terminals 32-0~32-n. An input clock signal ICLK is provided to the input clock terminal 31, and input data with a plurality of bits are provided in parallel to the input terminals 32-0~32-n in synchronization with the internal clock signal CLKI."

"A buffer amplifier 33 is connected to the input clock terminal 31, and means for input (e.g., flip flops, hereafter referred to as "FF") 34-0~34-n are respectively connected to the input terminals 32-0~32-n. The buffer amplifier 33 amplifies the input clock signal ICLK provided to the input clock terminal 31 to a specific level in order to provide it to internal circuits such as the FF's 34-0 and the like via a means for input clock distribution (e.g., an input clock supply path) 35."

Means for input clock supply (e.g., timing adjustment circuits) 36-0~36-n are provided between the input clock supply path 35 and the individual FF's 34-0~34-n respectively. The timing adjustment circuits 36-0~36-n generate internal input clock signals CLKI achieving uniform timing in synchronization with the input data by correcting the differences in the delay time of the input clock signal ICLK occurring due to different distribution routes at the input clock supply path 35 and provide the internal input clock signal CLKI thus generated to the FF's 34-0~34-n respectively.

The timing adjustment circuits 36-0~36-n are structured identically to one another, and are each constituted of three resistors 36a, 36b and 36c connected in series and gaps 36d, 36e and 36f, utilized to short or insert these resistors 36a 36b and 36c. The output sides of the individual timing adjustment circuits 36-0~36-n are respectively connected to the clock terminals of the FF's 34-0~34-n.

Each of the FF's 34-0~34-n holds the input data input to the corresponding input terminal 32-0~32-n with the timing of, for instance, a rise of the internal input clock signal CLKI provided to the clock terminal, and its output side is connected to the input side of an internal logic circuit 37.

For instance, the timing adjustment circuit 36-0 is constituted of a pattern formed from Al (aluminum) or the like in which the open gaps 36d and 36e and the shorted gap 36f are connected in series on a straight line, as illustrated in FIG. 1(b). In addition, as illustrated in FIG. 1(c), the gaps 36d~36f are formed immediately below the insulating film at the surface of the semiconductor substrate. Furthermore, a resistance layer having the resistors 36a~36c is formed under the gaps 36d~36f, and the resistance layer and the pattern layer are connected by a conductive material such as Al.

The gaps 36d~36f are provided in a circuit correction area which is separated from the other internal circuits to facilitate disconnection connection by utilizing a focused ion beam apparatus for integrated circuit development without affecting the other internal circuits. A focused ion beam apparatus achieves fine machining in the sub micron order such as disconnection and connection in an integrated circuit while remaining unaffected by the presence of a protective film and the like. A focused ion beam apparatus is capable of cutting protective films and wiring constituted of, for instance, Al by using the sputtering phenomenon to its advantage, whereby an ion beam finely focused to a point with a diameter of approximately 0.1 μm is radiated on a workpiece to drive out the atoms or molecules constituting the solid from the solid surface. Furthermore, the focused ion beam apparatus is capable of forming a metal film only over an irradiated area to connect the circuit by spraying a material gas on to the semiconductor substrate surface with a high efficiency gas gun to locally irradiate a focused ion beam.

As illustrated in FIG. 1(b), in order to clearly identify disconnecting or connecting positions and also to disconnect/connect with reliability, the pattern width on either side of the open gaps 36d and 36e is set large, whereas the shorted gap 36f has a narrow pattern.

(ii) Development Process

First, the layout of the entire integrated circuit is designed, and differences in wiring length of the input clock supply path 35 to the individual FF's 34-0~34-n are calculated. Based upon the differences in the wiring length thus calculated, a required delay time is calculated for each of the timing adjustment circuits 36-0~36-n. Then, the number of shorts and the number of openings at the gaps 36d~36f required to achieve the calculated delay time are determined on a temporary basis. Based upon the layout design described above, a prototype of the semiconductor integrated circuit is produced.

Next, the prototype semiconductor integrated circuit is evaluated using a focused ion beam apparatus for integrated circuit development, and an adjustment is implemented by shorting or opening as necessary the gaps 36d~36f at each of the timing adjustment circuits 36-0~36-n so that the input data are input by the individual FF's 34-0~34-n to the input terminals 32-0~32-n with almost uniform timing.

The patterns at the individual timing adjustment circuits 36-0~36-n having undergone the adjustment are set as the final circuit patterns.

(iii) Operation

The input clock signal ICLK provided to the input clock terminal 31 is amplified to achieve a specific level at the buffer amplifier 33 and then is distributed to the individual timing adjustment circuits 36-0~36-n via the input clock supply path 35. Delays set by the individual patterns at the timing adjustment circuits 36-0~36-n are applied to the individual input clock signals ICLK thus distributed at the timing adjustment circuits 36-0~36-n, and are then provided to the corresponding FF's 34-0~34-n as internal input clock signals CLKI.

The input data that are provided in parallel to the individual input terminals 32-0~32-n with uniform timing are held in synchronization with the internal input clock signals CLKI achieving almost uniform timing at the corresponding FF's 34-0~34-n. The input data held at the FF's 34-0~34-n are then provided to of the internal logic circuit 37.

As described above, the semiconductor integrated circuit in the first embodiment, which is provided with the timing adjustment circuits 36-0~36-n that are capable of making accurate adjustment, achieves advantages in that the degree of inconsistency in the delay time of the internal clock signal ICLK is reduced and in that a high-speed data transfer is enabled.

In addition, since the timing adjustment circuits 36-0~36-n can be adjusted with ease by utilizing a focused ion beam apparatus, the evaluation process is facilitated. Furthermore, since the design can be modified simply by shorting or opening the gaps 36d~36f at the timing adjustment circuits 36-0~36-n, the length of time required in design development can be reduced.

Second Embodiment

Figure 3A:
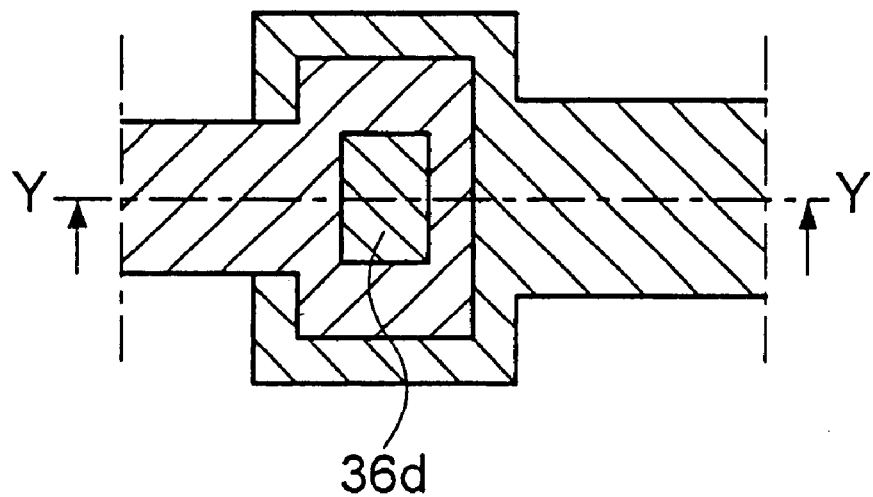
"FIGS. 3(a) and 3(b) are diagrams of the timing adjustment circuit in a second embodiment of the present invention;"
Figure 3B:
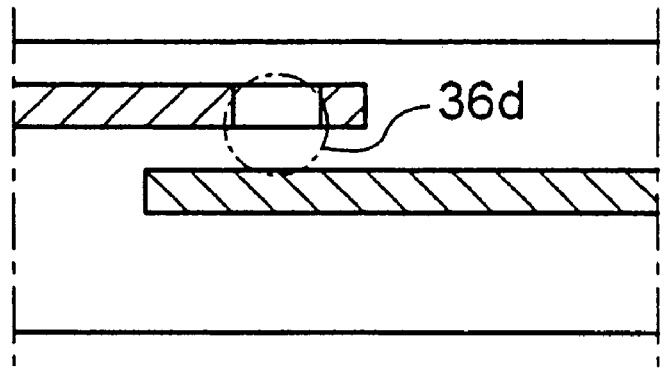

FIGS. 3(a) and 3(b) are structural diagrams of the timing adjustment adopted in the second embodiment of the present invention, with FIG. 3(a) presenting a plane view of its pattern and FIG. 3(b) presenting a sectional view through Y—Y in FIG. 3(a).

The structure of this timing adjustment circuit is adopted instead of the structure assumed in the timing adjustment circuits 36-0 etc., in FIG. 1(a) in the first embodiment. As illustrated in FIG. 3(b) the timing adjustment circuit provided with a wiring pattern constituted of a two-layer structure with an upper layer and a lower layer instead of a single surface. Other structural features are identical to those in the first embodiment and similar functions and advantages are achieved in the second embodiment.

Third Embodiment

Figure 4:
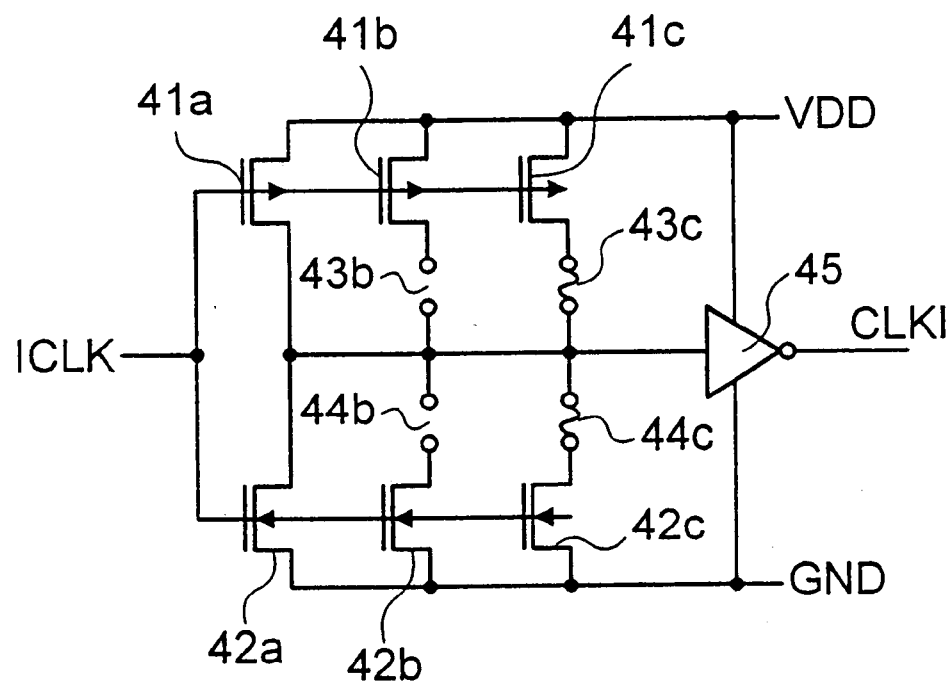
FIG. 4 is a block diagram of the timing adjustment circuit in a third embodiment of the present invention.

FIG. 4 is a block diagram of the timing adjustment circuit adopted in the third embodiment of the present invention.

The structure of this timing adjustment circuit is adopted instead of that assumed in the timing adjustment circuits 36-0 etc., in FIG. 1(a) in the first embodiment. The timing adjustment circuit is provided with N-channel MOS transistors, hereafter referred to as NMOS's 41a, 41b and 41c and drive P-channel MOS transistors hereafter referred to as PMOS's 42a, 42b and 42c, to the gates of which the input clock signal ICK distributed through the input clock supply path 35 is commonly provided. The sources of the NMOS's 41a~41c are connected to a source potential VDD, whereas the sources of the PMOS's 42a~42c are connected to a ground potential GND. The drains of the NMOS's 41b and 41c, and the drains of the PMOS's 42b and 42c are connected to the input side of an inverter 45, respectively via gaps 43b and 43c, and 44b and 44c. The internal input clock signal CLKI is output through the output side of the inverter 45. Other structural features are identical to those adopted in the first embodiment.

The gaps 43b, 43c, 44b and 44c at the timing adjustment circuit are adjusted in a manner similar to that adopted in the first embodiment. At this timing adjustment circuit, by controlling the quantities of the NMOS's 41a~41c and the PMOS's 42a~42c that are connected in parallel, the delay time can be adjusted to achieve the advantages similar to those achieved in the first embodiment.

Fourth Embodiment

Figure 5:
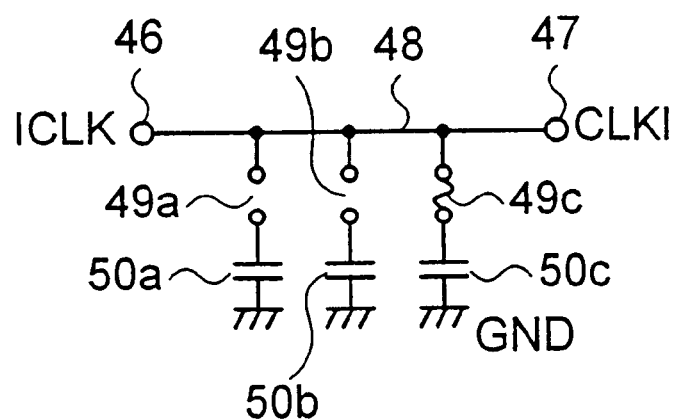
FIG. 5 is a block diagram of the timing adjustment circuit in a fourth embodiment of the present invention.

FIG. 5 is a block diagram of the timing adjustment circuit adopted in the fourth embodiment of the present invention.

The structure of this timing adjustment circuit is adopted instead of that assumed in the timing adjustment circuits 36-0 etc., in FIG. 1(a) in the first embodiment. It is provided with a terminal 46 to which the input clock signal ICK distributed through the input clock supply path 35 is provided, a terminal 47 to which the internal input clock signal CLKI is output and a wiring 48 connecting the terminals 46 and 47. In addition, capacitors 50a, 50b and 50c are connected between the wiring 48 and the ground potential GND, respectively via gaps 49a, 49b and 49c.

The gaps 49a~49c at this timing adjustment circuit are adjusted in a manner similar to that adopted in the first embodiment. The timing adjustment circuit, in which the delay time is adjusted by controlling the electrostatic capacities of the capacitors 50a~50c connected between the wiring 48 and the ground potential GND, achieves advantages similar to those achieved in the first embodiment.

Fifth Embodiment

Figure 6:
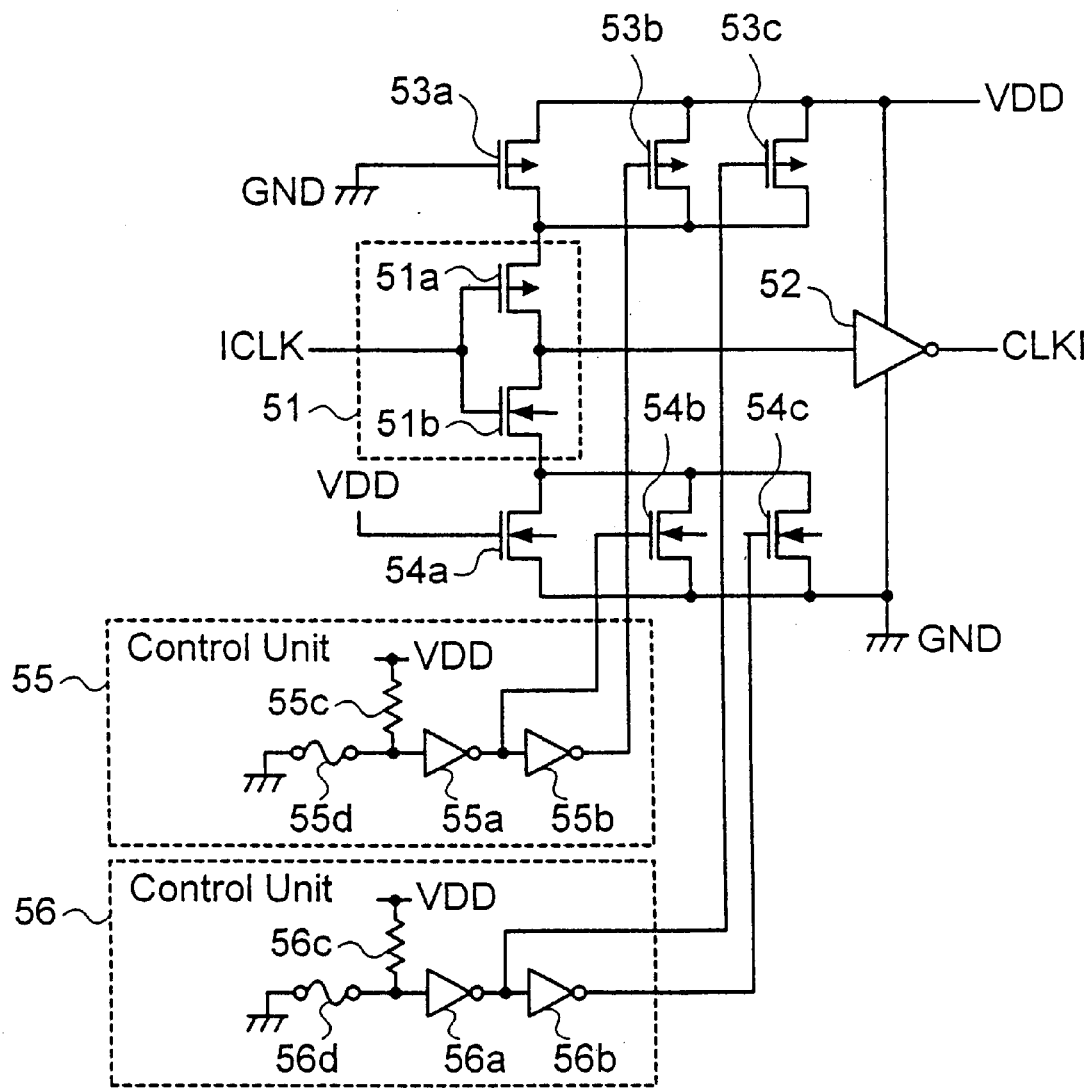
FIG. 6 is a block diagram of the timing adjustment circuit in a fifth embodiment of the present invention.

FIG. 6 is a block diagram of the timing adjustment circuit adopted in the fifth embodiment of the present invention.

"The structure of this timing adjustment circuit is adopted instead of that assumed in the timing adjustment circuits 36-0 etc., in FIG. 1(a) in the first embodiment, and the timing adjustment circuit is provided with an inversion amplifier unit (e.g., an inverter) 51. The inverter 51 inverts and amplifies the ICLK distributed through the input clock supply path 35. The inverter 51 is constituted of a PMOS 51a and an NMOS 51b. The input clock signal ICLK is commonly provided to the gates of the PMOS 51a and the NMOS 51b. The drains of the PMOS 51a and the NMOS 51b are commonly connected to the input side of an inverter 52. The internal input clock signal CLKI is output through the output side of the inverter 52."

"First through third transistors (e.g., PMOS's) 53a, 53b and 53c are connected in parallel between the source of the PMOS 51a and the source potential VDD. In addition, fourth through sixth transistors (e.g., NMOS) 54a, 54b and 54c are connected in parallel between the source of the NMOS 51b and the ground potential GND. The gate of the PMOS 53a is securely connected to the ground potential GND and is set to sustain an ON state at all times. The gate of the NMOS 54a is securely connected to the source potential VDD and is set to sustain an ON state at all times."

"A first control signal and a third control signal are respectively provided to the gates of the PMOS 53b and the NMOS 54b from a first control unit 55. The control unit 55 is provided with two inverters 55a and 55b that are connected with each other in cascade. The input side of the inverter 55a at the front stage is connected to the source potential VDD via a resister 55c and is also connected to the ground potential GND by a first fuse 55d. The first control signal is output through the output side of the inverter 55a and is then provided to the gate of the NMOS 54b. In addition, the third control signal is output through the output side of the inverter 55b to be provided to the gate of the PMOS 53b."

"A second control signal and a fourth control signal are respectively provided to the gates of the PMOS 53c and the NMOS 54c from a second control unit 56. The control unit 56 is provided with two inverters 56a and 56b that are connected with each other in cascade. The input side of the inverter 56a at the front stage is connected to the source potential VDD via a resister 56c and is also connected to the ground potential GND by a second fuse 56d. The second control signal is output through the output side of the inverter 56a and is then provided to the gate of the PMOS 53c. In addition, the fourth control signal is output through the output side of the inverter 56b to be provided to the gate of the NMOS 54c."

"If neither of the fuses 55d and 56d is disconnected, "L" and "H" are respectively applied to the gates of the PMOS 53b and the NMOS 54b and the PMOS 53b and the NMOS 54b are both set in an ON state. At the same time, "H" and "L" are respectively applied to the gates of the PMOS 53c and the NMOS 54c and the PMOS 53c and the NMOS 54c are set in an OFF state. As a result, the inverter 51 is connected to the source potential VDD via the PMOS's 53*a* and 53*b* and is also connected to the ground potential GND via the NMOS's 54*a* and 54*b* to receive power as a drive source."

"If only the fuse 55*d* is disconnected, "H" and "L" are respectively applied to the gates of the PMOS 53*b* and the NMOS 54*b* to set the PMOS 53*b* and the NMOS 54*b* in an OFF state. At the same time, "H" and "L" are respectively applied to the gates of the PMOS 53*c* and the NMOS 54*c* to set the PMOS 53*c* and the NMOS 54*c* in an OFF state. As a result, the inverter 51 is connected to the source potential VDD via the PMOS 53*a* and is also connected to the ground potential GND via the NMOS 54*a* to receive power as a drive source. Thus, by disconnecting only the fuse 55*d*, the quantity of power for drive supplied to the inverter 51 can be reduced to increase the delay time of the input clock signal ICLK."

"If only the fuse 56*d* is disconnected , "L" and "H" are respectively applied to the gates of the PMOS 53*b* and the NMOS 54*b* to set the PMOS 53*b* and the NMOS 54*b* in an ON state. At the same time, "L" and "H" are respectively applied to the gates of the PMOS 53*c* and the NMOS 54*c* to set the PMOS 53*c* and the NMOS 54*c* in an ON state. As a result, the inverter 51 is connected to the source potential VDD via the PMOS's 53*a*, 53*b* and 53*c* and it is also connected to the ground potential GND via the NMOS's 54*a*, 54*b* and 54*c* to receive power as a drive source. Thus, by disconnecting the fuse 56*d*, the quantity of source power for drive supplied to the inverter 51 can be increased to reduce the delay time of the input clock signal ICLK."

As explained above, by utilizing the timing adjustment circuit in the fifth embodiment, in which the delay time of the input clock signal ICLK can be increased/reduced freely simply by disconnecting the fuse 55*d*/56*d*, advantages are achieved in that the timing of the internal input clock signal CLKI can be adjusted within a specific range and in that high-speed data transfer is enabled.

Furthermore, since the delay time of the input clock signal ICLK can be adjusted freely by disconnecting the fuse 55*d*/56*d* by employing, for instance, a laser cutting apparatus, another advantage is achieved in that a special apparatus such as a focused ion beam apparatus is not required. Thus, the present invention may be adopted with ease on the production line of a manufacturing plant.

Sixth Embodiment

Figure 7:
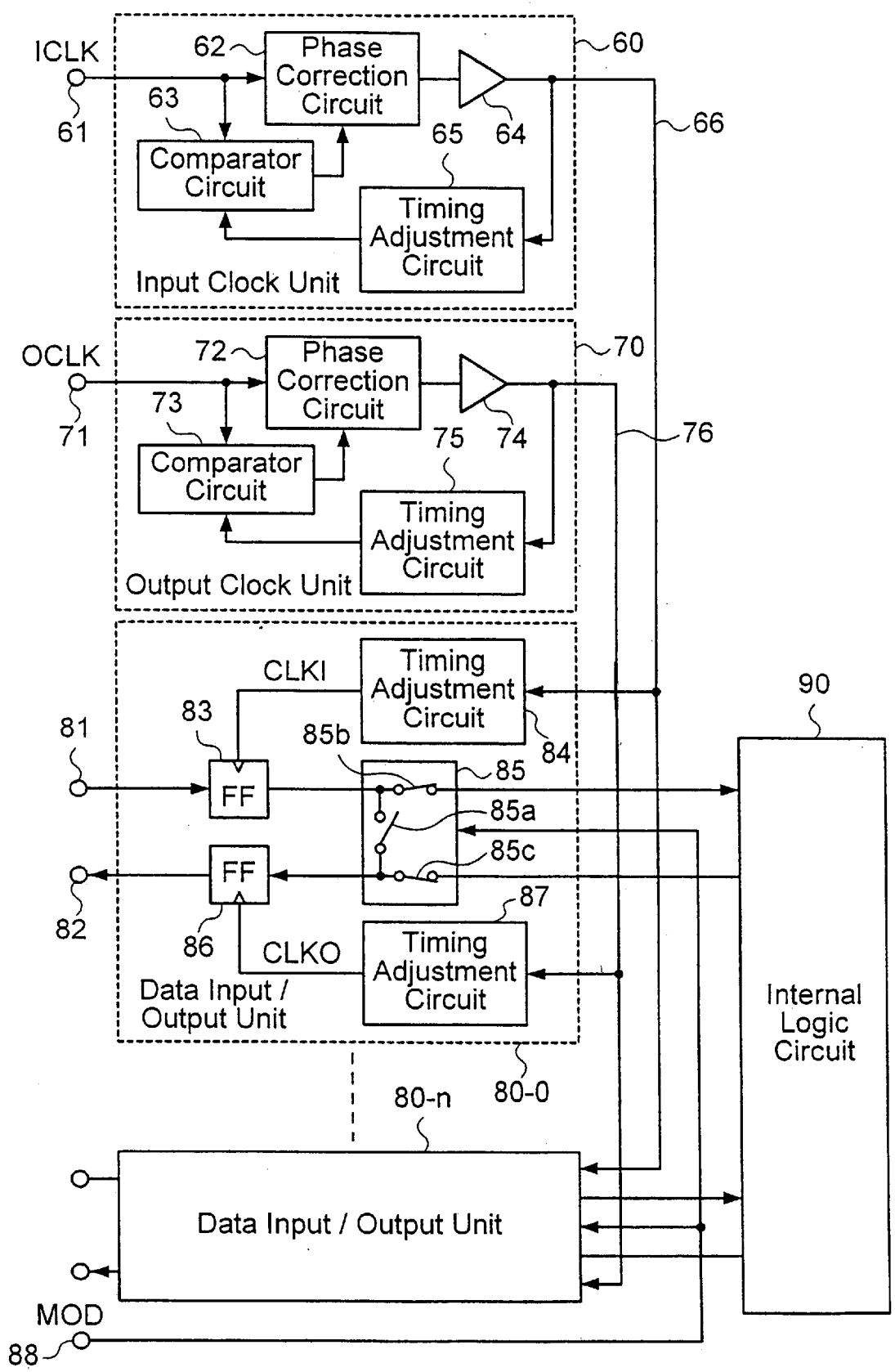
FIG. 7 is a block diagram of the semiconductor integrated circuit in a sixth embodiment of the present invention.

FIG. 7 is a block diagram of the semiconductor integrated circuit in the sixth embodiment of the present invention.

The following is an explanation of the structure (i), the adjustment method (ii) and the operation (iii) of this semiconductor integrated circuit.
(i) Structure The semiconductor integrated circuit is provided with an input clock unit 60, an output clock unit 70, a plurality of data input/output units 80-0~80-n and an internal logic circuit 90.

The input clock unit 60 is provided with an input clock terminal 61 to which an input clock signal ICK indicating the timing of data input is provided. A phase correction circuit 62 and a first input side of a comparator circuit 63 are connected to the input clock terminal 61. The phase correction circuit 62 corrects the phase of the input clock signal ICLK in conformance to the signal indicating the comparison results provided by the comparator circuit 63 and outputs the corrected signal. A buffer amplifier 64 is connected to the output side of the phase correction circuit 62. A first means for delay (e.g., a timing adjustment circuit) 65 and a means for input clock distribution (e.g., an input clock supply path) 66 are connected to the output side of the buffer amplifier 64. The timing adjustment circuit 65 adjusts the phase of the input clock signal ICLK output by the buffer amplifier 64 and provides the adjusted signal to a second input side of the comparator circuit 63. Then, at the comparator circuit 63, a control signal that will eliminate the phase difference between the first input side and the second input side is generated and is provided to the phase correction circuit 62.

The output clock unit 70 is provided with an output clock terminal 71 to which an output clock signal OCLK indicating the timing of data output is provided. A phase correction circuit 72 and a first input side of a comparator circuit 73 are connected to the output clock terminal 71. The phase correction circuit 72 and the comparator circuit 73 are identical to the phase correction circuit 62 and the comparator circuit 63 in the input clock unit 60. A buffer amplifier 74 is connected to the output side of the phase correction circuit 72 and a second means for delay (e.g., a timing adjustment circuit) 75 and a means for output clock distribution (e.g., an output clock supply path) 76 are connected to the output side of the buffer amplifier 74. The timing adjustment circuit 75 adjusts the phase of the output clock signal OCLK output by the buffer amplifier 74 and provides the adjusted signal to a second input side of the comparator circuit 73. Then, at the comparator circuit 73, a control signal that will eliminate the phase difference between the first output side and the second output side is generated and is provided to the phase correction circuit 72.

"The data input/output units 80-0~80-n are all structured identically to one another. For instance, the data input/output unit 80-0 is provided with an input terminal 81 and an output terminal 82. Input data are provided to the input terminal 81 from the outside in synchronization with the input clock signal ICLK. In addition, output data are output to the outside through the output terminal 82 in synchronization with the output clock signal OCLK. The input side of the means for input (e.g., an FF) 83 is connected to the input terminal 81, with an internal input clock signal CLKI provided to the clock terminal of the FF 83 through the input clock supply path 66 via a means for input clock supply (e.g., a timing adjustment circuit) 84. The FF 83 holds and outputs the input data with the timing of, for instance, a rise of the internal input clock signal CLKI. In addition, the timing adjustment circuit 84 adjusts the difference in the delay time of the input clock signal ICLK resulting from the difference in the length of the distribution route at the input clock supply path 66 to generate an internal input clock signal CLKI achieving uniform timing which is then provided to the FF 83."

A means for data loop-back (e.g., a selector switch) 85 is connected to the output side of the FF 83. The selector switch 85, which is constituted of, for instance, three switches 85*a*, 85*b* and 85*c* loops back the input data output from the FF 83 to the output terminal 82 when a test mode is specified by a mode signal MOD provided from the outside. In addition, the selector switch 85 provides the input data output from the FF 83 to the internal logic circuit 90 and outputs the output data output from the internal logic circuit 90 to the output terminal 82 if a normal mode is specified by the mode signal MOD.

The input side of a means for a output (e.g., an FF) 86 is connected to the loop-back output side of the selector switch 85. An internal output clock signal CLKO is provided to the clock terminal of the FF 86 via a means for output clock supply (e.g., a timing adjustment circuit) 87 from the output clock supply path 76. The FF 86 holds the output data from the internal logic circuit 90 and outputs them to the output terminal 82 with the timing of, for instance, a rise of the internal output clock signal CLKO. In addition, the timing adjustment circuit 87 adjusts the difference in the delay time of the output clock signal OCLK resulting from the difference in the length of the distribution route at the output clock supply path 76 to generate an internal output clock signal CLKO achieving a uniform timing which is then provided to the FF 86.

This semiconductor integrated circuit is further provided with a control terminal 88 to which the mode signal MOD is provided, and the mode signal MOD is commonly provided to the selector switches at the individual data input/output units 80-0~80-n from the control terminal 88. It is to be noted that the control terminal 88 is utilized only when setting the test mode to adjust the timing adjustment circuits 65, 75, 84 and 87 during the manufacturing stage, as is detailed later. Thus, since it is no longer required when the adjustment is completed, it is not necessary to provide it as an external terminal of the semiconductor integrated circuit.

Figure 8:
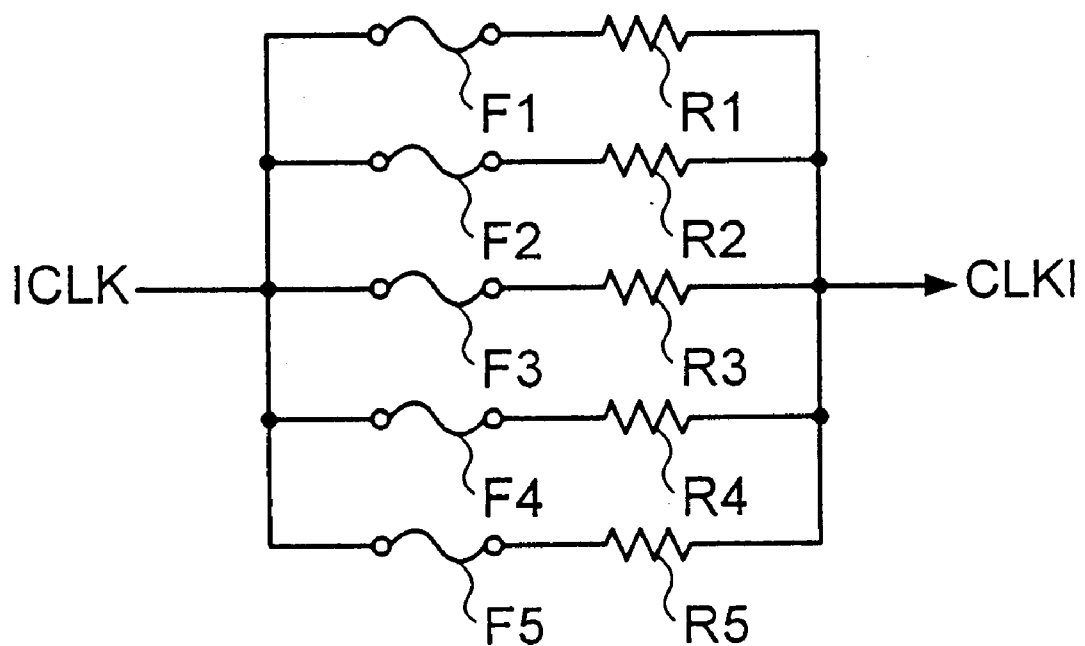
FIG. 8 illustrates a structural example that may be adopted by the timing adjustment circuits 65, 75, 84 and 87 in FIG. 7.

FIG. 8 presents an example of a structure that may be adopted in the timing adjustment circuits 65, 75, 84 and 87 in FIG. 7.

This timing adjustment circuit is constituted by connecting in series a fuse Fi (i=1, 2, . . . , 5) and a delay element (e.g., a resister) Ri and connecting in parallel the five serial circuits each constituted of the fuse Fi and the resistor Ri. The fuses Fi are set at a specific disconnection area on a semiconductor substrate so that the individual fuses Fi can be separately disconnected by a laser cutting apparatus during a test conducted in the process of semiconductor wafer production. In addition, the individual resistors Ri have the same resistance value. By disconnecting the fuses Fi, the overall resistance at the timing adjustment circuit can be varied to adjust the delay time of the input clock signal ICLK or the like.

(ii) Adjustment Method

Figure 9:
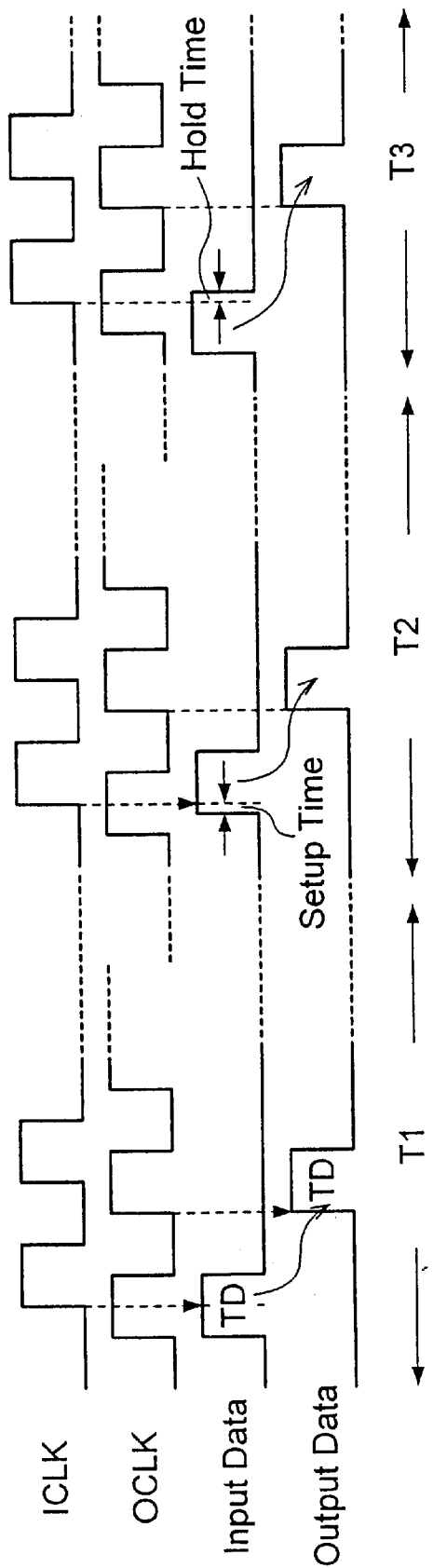
FIG. 9 is a timing chart of the operation performed during the adjustment in the semiconductor integrated circuits in FIG. 7.

FIG. 9 is a timing chart of the operation performed at the semiconductor integrated circuit shown in FIG. 7 during an adjustment. The following is an explanation of the method employed to adjust the timing adjustment circuits 65 and 84 in the semiconductor integrated circuit in FIG. 7, given in reference to FIG. 9.

The adjustment on the timing adjustment circuit 65 and the like is implemented during a test conducted before the semiconductor wafer with circuits formed thereon is cut into individual semiconductor chips. When conducting the test, the mode signal MOD set in the test mode (e.g., at "H" level) is applied to the control terminal 88 of a semiconductor integrated circuit through a probe of the semiconductor wafer test apparatus. This sets the selector switches 85 at the individual data input/output units 80-0~80-n in a loop-back state, in which the output sides of the FF's 83 are directly connected to the input sides of the FF's 86 and the internal logic circuit 90 is disconnected from the data input/output units 80-0~80-n.

First, during a period T1 in FIG. 9, test data TD are input through the input terminal 81 by ensuring that the input clock signal ICLK rises exactly halfway through the time period during which the input data are input.

As a result, the test data TD are held by the FF 83 and are looped back to the FF 86 of the selector switch 85. The TD looped back to the FF 86 are held at the FF 86 at a rise of the output clock signal OCLK and are output as output data through the output terminal 82. The output data output at the output terminal 82 are checked to determine whether or not they match the test data TD provided to the input terminal 81 to confirm that there is no problem with respect to the input/output function.

Next, during a period T2, the timing with which the input data are input is delayed in steps over specific intervals relative to the input clock signal ICLK. Then, the input timing immediately before the output data output through the output terminal 82 no longer match the test data TD provided to the input terminal 81 is measured. The period of time elapsing between the point in time at which the test data TD are input and the rise of the input clock signal ICLK constitutes the setup time. Since the setup time varies among the individual data input/output units 80-0~80-n, the lengths of setup time at the individual data input/output units 80-0~80-n are measured and recorded.

Then, during a period T3 in FIG. 9, the timing with which the test data TD are input is advanced in steps over specific intervals relative to the input clock signal ICLK. The length of time elapsing between the input timepoint immediately before the output data output through the output terminal 82 no longer match the test data TD provided to the input terminal 81 and the rise of the input clock signal ICLK is measured as the hold time. Since the lengths of hold time varies among the individual data input/output units 80-0~80-n, the lengths of hold time at the individual data input/output units 80-0~80-n are measured and recorded.

Based upon the lengths of setup time and hold time at the individual data input/output units 80-0~80-n thus measured, an adjustment reference value is determined. First, setup time minus hold time is calculated for each of the data input/output units 80-0~80-n. Then, the largest value among the values thus calculated, i.e., the value corresponding to the data input/output unit 80-i with the largest delay is set as the adjustment reference value. The differences between the calculated values for the other data input/output units 80-0~80-n and the adjustment reference value are then calculated, and based upon the results, the number of fuses F1~F5 to be disconnected is determined for each of the timing adjustment circuits 84 corresponding to the individual data input/output units 80-0~80-n. By disconnecting the fuses F1~F5, the resistance values at the individual timing adjustment circuits 84 increase and the internal input clock signals CLKI provided to the FF's 83 are delayed so that the phases of the internal input clock signals CLKI provided to the FF's 83 of all the data input/output units 80-0~80-n are matched.

"Next, the number of fuses F1~F5 to be disconnected at the timing adjustment circuit 65 is determined based upon the adjustment reference value. By disconnecting the fuses F1~F5 at the timing adjustment circuit 65, the resistance value increases to cause a delay in the input clock signal ICLK input to the comparator circuit 63. This delay input clock signal ICLK and the input clock signal ICLK provided through the input clock terminal 61 are compared with each other and a correction control signal is output to the phase correction circuit 62. Thus, the input clock signal ICLK which is advanced by the degree corresponding to the delay that has increased while the signal has passed from the buffer amplifier 64 to the comparator circuit 63 is output from the phase correction circuit 62. As a result, the timing with which the input clock signal ICLK is provided to the individual data input/output units 80-0~80-n via the input clock supply path 66 is uniformly advanced to achieve timing that allows the internal clock signal CLKI to rise exactly halfway through the time period during which the input data are input."

In addition, the timing adjustment circuits 75 and 87 are adjusted in a manner almost identical to that described above.

Namely, the timing with which the output clock signal OCLK provided to the output clock terminal 71 rises is advanced in steps over specific intervals relative to the reference output clock signal OCLK. Then, the length of time elapsing between the time point immediately before the output data output from each output terminal 82 no longer match the test data TD provided to the corresponding input terminal 81 and a rise of the reference output clock signal OCLK is measured as the maximum data output time. Since the length of maximum data output time varies among the individual data input/output units 80-0~80-n, the individual lengths of maximum data output time at the data input/output units 80-0~80-n are measured and recorded. In addition, the timing with which the output clock signal OCLK is provided to the output clock terminal 71 is delayed in steps over specific intervals relative to the reference output clock signal OCLK. Then, the length of time elapsing between the time point immediately before the output data output from each output terminal 82 no longer match the test data TD provided to the corresponding input terminal 81 and a rise of the reference output clock signal OCLK is measured as the minimum data output time. Since the length of minimum data output time varies among the individual data input/output units 80-0~80-n, the lengths of minimum data output time at the individual data input/output units 80-0~80-n are measured and recorded.

Based upon the lengths of maximum data output time and minimum data output time at the individual data input/output units 80-0~80-n thus measured, an adjustment reference value is determined. First, "maximum data output time minus minimum data output time" is calculated for each of the data input/output units 80-0~80-n. Then, the largest value among the values thus calculated, i.e., the value corresponding to the data input/output unit 80-i with the largest delay is set as the adjustment reference value. The differences between the calculated values for the other data input/output units 80-0~80-n and the adjustment reference value are then calculated, and based upon the results, the number of fuses F1~F5 to be disconnected is determined for each of the timing adjustment circuits 87 corresponding to the individual data input/output units 80-0~80-n. By disconnecting the fuses F1~F5, the resistance values at the individual timing adjustment circuits 87 increase and the internal output clock signals CLKO provided to the FF's 86 are delayed so that the phases of the internal output clock signals CLKO provided to the FF's 86 of all the data input/output units 80-0~80-n are matched.

Next, the number of fuses F1~F5 to be disconnected at the timing adjustment circuit 75 is determined based upon the adjustment reference value. By disconnecting the fuses F1~F5 at the timing adjustment circuit 75, the resistance value increases to cause a delay in the output clock signal OCLK input to the comparator circuit 73. This delayed output clock signal OCLK and the output clock signal OCLK provided through the output clock terminal 71 are compared with each other and a correction control signal is output to the phase correction circuit 72. Thus, the output clock signal OCLK which is advanced by the degree corresponding to the delay that has increased while the signal has passed from the buffer amplifier 74 to the comparator circuit 73 is output from the phase correction circuit 72. As a result, the timing with which the output clock signal OCLK is provided to the individual data input/output units 80-0~80-n via the output clock supply path 76 is all advanced to achieve internal output clock signals CLKO, the timing of which matches the timing of the output clock signal OCLK.

(iii) Operation

For instance, when inputting data in this semiconductor integrated circuit, the input clock signal ICLK provided to the input clock terminal 61 undergoes a phase correction at the phase correction circuit 62, and is then amplified at the buffer amplifier 64 before it is distributed to the timing adjustment circuits 84 of the individual data input/output units 80-0~80-n via the input clock supply path 66. During this process, the comparator circuit 63 and the phase correction circuit 62 engage in a phase correction so that the phase of the input clock signal ICLK becomes advanced by a degree corresponding to the delay set at the timing adjustment circuit 65.

Delays resulting from the individual adjustments performed at the timing adjustment circuits 84 of the data input/output units 80-0~80-n are applied to the input clock signal ICLK and then the individual delayed signals are provided to the clock terminals of the corresponding FF 83 as internal input clock signals CLKI.

The input data provided in parallel to the input terminals 81 of the individual data input/output units 80-0~80-n with uniform timing are held by the FF's 83 at the data input/output units 80-0~80-n in synchronization with the corresponding internal input clock signals CLKI achieving almost uniform timing. The input data held at the FF's 83 of the individual data input/output units 80-0~80-n are provided to the internal logic circuit 90 via the selector switches 85.

When outputting data in the semiconductor integrated circuit, the output clock signal OCLK provided to the output clock terminal 71 undergoes a phase correction at the phase correction circuit 72, and is then amplified at the buffer amplifier 74 before it is distributed to the timing adjustment circuits 87 of the individual data input/output units 80-0~80-n via the output clock supply path 76. During this process, the comparator circuit 73 and the phase correction circuit 72 engage in a phase correction so that the phase of the output clock signal OCLK becomes advanced by a degree corresponding to the delay set at the timing adjustment circuit 75.

Delays resulting from the individual adjustments performed at the timing adjustment circuits 87 of the data input/output units 80-0~80-n are applied to the output clock signal OCLK and then the delayed signals are provided to the clock terminals of the corresponding FF's 86 as internal output clock signals CLKO.

The output data provided to the FF's 86 via the selector switch 85 in the individual data input/output units 80-0~80-n from the internal logic circuit 90 are held in synchronization with the internal output clock signals CLKO achieving uniform timing. Then, they are output in parallel through the individual output terminals 82 with uniform timing.

As explained above, the semiconductor integrated circuit in the sixth embodiment, which is provided with the timing adjustment circuits 65, 75, 84 and 87 that enable highly accurate adjustment, is capable of generating internal input clock signals CLKI and internal output clock signals CLKO with no phase difference. In addition, there is an advantage in that the degree of inconsistency in the delay time is reduced and in that high-speed data transfer is enabled.

Furthermore, since the timing adjustment circuits 65, 75, 84 and 87 can be individually adjusted by employing a laser cutting apparatus or the like during a test conducted on the semiconductor wafer, an advantage is achieved in that the inconsistency among individual products can be minimized.

Moreover, since the timing with which data are input is shifted relative to the input clock signal ICLK and the input data are held during the adjustment to check the output data looped back from a selector switch 85, an advantage is achieved in that the setup time and the hold time can be accurately measured by employing a low-speed test apparatus.

Seventh Embodiment

Figure 10:
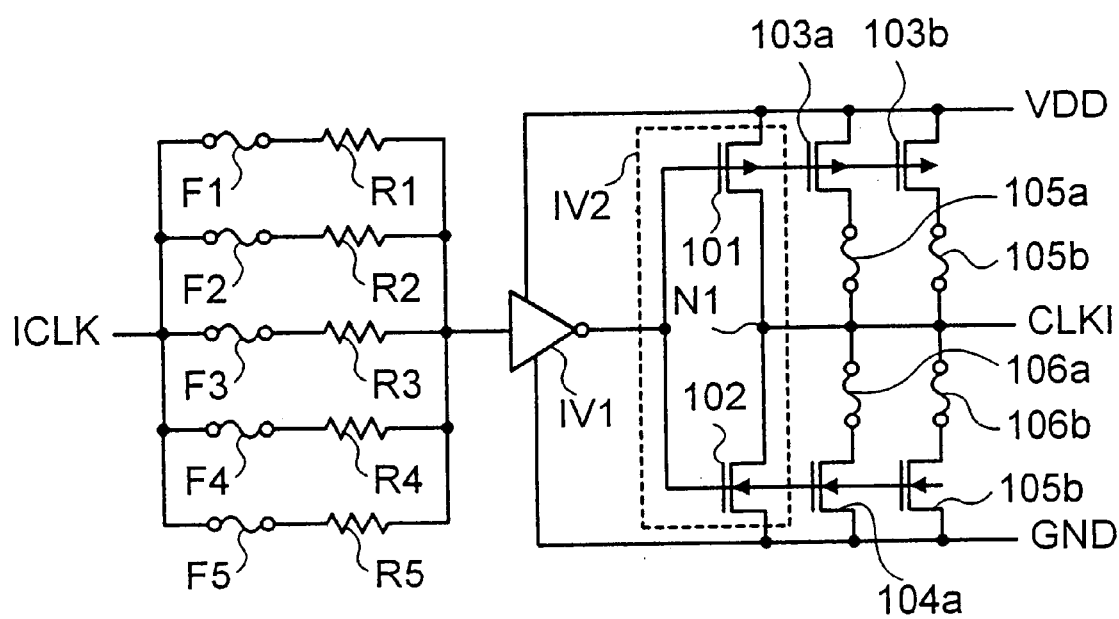
FIG. 10 is a block diagram of the timing adjustment circuit in a seventh embodiment of the present invention.

FIG. 10 is a block diagram of the timing adjustment circuit adopted in the seventh embodiment of the present invention.

The structure of this timing adjustment circuit may be adopted instead of the structure of the timing adjustment circuit 65, 75, 84 and 87 shown in FIG. 7 that are employed in the sixth embodiment, with the same reference numbers assigned to identical elements.

As in the timing adjustment circuit shown in FIG. 8, this timing adjustment circuit is provided with a delay circuit achieved by connecting in parallel five serial circuits, each constituted of a fuse Fi and a resistor Ri connected in series. In addition, first and second inversion amplifier units (e.g., inverters) IV1 and IV2 are connected in cascade at the output side of the delay circuit.

The inverter IV2 is constituted of an NMOS 101 and a PMOS 102. The gates of the NMOS 101 and the PMOS 102 are commonly connected to the output side of the inverter IV1. The sources of the NMOS 101 and the PMOS 102 are respectively connected to the source potential VDD and the ground potential GND. In addition, the drains of the NMOS 101 and the PMOS 102 are connected to an output node N1, and a clock signal having undergone timing adjustment such as an internal input clock signal CLKI is output to the output node N1.

In addition, this timing adjustment circuit is provided with NMOS's 103a and 103b and PMOS's 104a and 104b. The sources of the NMOS's 103a and 103b are connected to the source potential VDD and their gates are commonly connected to the gate of the NMOS 101. The drains of the NMOS's 103a and 103b are connected to the output node N1 via the fuses 105a and 105b respectively. The sources of the PMOS's 104a and 104b are connected to the ground potential GND and their gates are commonly connected to the gate of the PMOS 102. The drains of the PMOS's 104a and 104b are connected to the output node N1 via fuses 106a and 106b respectively.

The fuses Fi, 105a, 105b, 106a and 106b, together with the fuses F1~F5, are set at a specific disconnection area on a semiconductor substrate so that the individual fuses can be separately disconnected by a laser cutting apparatus during a test conducted in the process of semiconductor wafer production. In addition, the individual resistors Ri have the same resistance value. By disconnecting the fuses Fi, the overall resistance at the timing adjustment circuit can be varied to adjust the delay time of the clock signal.

Furthermore, by disconnecting the fuses 105a, 105b, 106a and 106b, the drive capability of the inverter IV2 can be adjusted, and a finer adjustment of the length of the delay of the clock signal is achieved through the drive capability adjustment.

Other structural features are identical to those adopted in the seventh embodiment, with similar functions and advantages to those realized in the seventh embodiment achieved. Moreover, since the timing adjustment circuit in the eighth embodiment is provided with the inverters IV1 and IV2 at the stage rearward of the delay circuit, there is an added advantage in that the waveform of the clock signal that has become dulled at the delay circuit can be shaped and output.

It is to be noted that the present invention is not limited to the applications explained in reference to the embodiments, and allows a number of variations. Examples of such variations include (a)~(o) below.

(a) The number of resistors 36a~36c at each of the timing adjustment circuits 36-0 etc., in FIG. 1 does not need to be three. By providing a greater number of resistors, even finer adjustment is enabled.

(b) The individual resistance values at the resistors 36a~36c in FIG. 1 do not need to be the same. For instance, by using resistance values that are weighted at 1, 2, 4, . . . , for instance, the overall composite resistance can be set over a wide range while using a small number of resistors.

(c) The pattern used at the timing adjustment circuits 36-0 etc., in FIG. 1 is not limited to those shown in FIGS. 1(b), 1(c) and FIG. 3. Any pattern can be used as long as it allows a circuit correction implemented by using a focused ion beam apparatus.

(d) The number of transistors, i.e., the number of NMOS's 41a~41c and the number of PMOS's 42a~42c, in FIG. 4 does not need to be three. By providing in parallel a larger number of transistors, even finer adjustment is enabled. In addition, the dimensions of these transistors do not need to be the same. By providing transistors with different dimensions, the drive capability can be set over a wide range while employing a small number of transistors.

(e) The number of capacitors 50a~50c in FIG. 5 does not need to be three. By providing a larger number of capacitors, even finer adjustment is enabled. In addition, the individual capacitance values of these capacitors do not need to be the same. By using capacitance values that are weighted at 1, 2, 4, . . . , for instance, an overall capacity can be set over a wide range while employing a small number of capacitors.

(f) The number of control units 55 and 56 in FIG. 6 does not need to be two. By providing a larger number of control units and corresponding NMOS's and PMOS's, finer adjustment is enabled.

(g) The structures adopted in the control units 55 and 56 are not limited to those adopted in the circuits shown in FIG. 6. Any circuit structure may be adopted as long as it sets the NMOS's and PMOS's to an ON state or an OFF through disconnection of fuses.

(h) The structures of the input clock unit 60 and the output clock unit 70 are not limited to those adopted in the circuits shown in FIG. 7. They may be constituted of, for instance, only the buffer amplifier 64 and the buffer amplifier 74 respectively.

(i) The adjustment range of the timing adjustment circuits 84 in the individual data input/output units 80 in FIG. 7 may be expanded so that the timing adjustment circuit 65 in the input clock unit 60 may be omitted altogether.

(j) The adjustment range of the timing adjustment circuits 87 in the individual data input/output units 80 in FIG. 7 may be expanded so that the timing adjustment circuit 75 in the output clock unit 70 may be omitted altogether.

(k) If there is a sufficient margin in the data output timing, the timing adjustment circuits 87 in the data input/output units 80 in FIG. 7 may be omitted.

(l) While the FF's 83 and 86 are employed to constitute the means for input and the means for output in the data input/output units 80 in FIG. 7, these means may each constituted of another type of data latch circuit instead of an FF.

(m) The selector switches 85 in FIG. 7 may each be constituted of a logic gate or the like instead of the structure shown in FIG. 7.

(n) The timing adjustment circuits 65, 75, 84 and 87 in FIG. 7 may adopt structures other than those shown in FIGS. 8 and 10. They do not need to be structured identically to one another, as long as the required adjustment ranges are assured.

(o) While the semiconductor integrated circuits in FIGS. 1 and 7 are respectively provided with the internal logic circuits 37 and 90, the present invention may be adopted in a semiconductor memory or the like in a similar manner.

As explained above in detail, according to the first invention, which is provided with the means for input clock supply that enables an adjustment of differences in the delay time of the input clock signal through connecting or disconnecting serial elements or parallel elements, internal input clock signals with uniform phase can be provided to the individual means for input.

According to the second invention, in which serial elements or parallel elements employed for adjustment at the means for input clock supply in the first invention are provided in a circuit correction area, the adjustment can be performed with ease through connection and disconnection by utilizing a circuit correction apparatus.

According to the third invention, the means for input clock supply in the first invention is provided with the first control unit that reduces the quantity of power supplied to the inversion amplifier unit by disconnecting the first fuse and the second control unit that increases the quantity of power supplied to the inversion amplifier unit by disconnecting the second fuse. As a result, the drive capability of the inversion amplifier unit can be increased/reduced simply by disconnecting the fuses to achieve an advantage in that differences in the delay time of the input clock signal can be adjusted with ease using a circuit cutting apparatus which is simpler than a circuit correction apparatus.

According to the fourth invention, the means for data loop-back that output the input data held at the means for input in a loop-back in conformance to a specification made by the mode signal to the means for output as output data are provided. As a result, a decision can be made as to whether not the input data have been correctly input in synchronization with the input clock signal to achieve an advantage in that the timing adjustment for the means for input clock supply and the means for output clock supply is facilitated.

According to the fifth invention, the means for input clock supply in the fourth invention are each provided with a plurality of disconnectable delay elements. Thus, an advantage is achieved in that by disconnecting a specific number of delay elements corresponding to a given delay time, internal input clock signals at the same phase can be provided to the individual means for input.

According to the sixth invention, an inversion amplifier unit whose drive capability can be controlled through fuse disconnection is provided on the output side of the plurality of delay elements in the means for input clock supply in the fifth invention. As a result, the adjustment range of the delay time is further expanded and internal input clock signals whose waveforms are shaped can be obtained.

According to the seventh invention, the means for output clock supply in the fourth invention is provided with a plurality of disconnectable delay elements. Thus, an advantage is achieved in that by disconnecting a specific number of delay elements corresponding to a given delay time, internal output clock signals can be provided to the individual means for output at the same phase.

According to the eighth invention, an inversion amplifier unit whose drive capability can be controlled through fuse disconnection is provided on the output side of the plurality of delay elements in the means for output clock supply in the seventh invention. As a result, the adjustment range of the delay time is further expanded and internal output clock signals whose waveforms are shaped can be obtained.

According to the ninth invention, the first means for delay constituted of a plurality of delay elements of that can be adjusted through disconnection is provided between the input clock terminal and the means for input clock distribution in the fourth invention. Thus, an advantage is achieved in that the delay times of the input clock signal can be adjusted uniformly.

According to the tenth invention, an inversion amplifier unit whose drive capability can be controlled through fuse disconnection is provided on the output side of the plurality of delay elements in the means for input clock supply in the ninth invention. As a result, the adjustment range of the delay time is further expanded and internal input clock signals whose waveforms are shaped can be obtained.

According to the eleventh invention, the second means for delay constituted of a plurality of delay elements that can be adjusted through disconnection is provided between the output clock terminal and the means for output clock distribution in the fourth invention. Thus, an advantage is achieved in that the delay times of the output clock signal can be adjusted uniformly.

According to the twelfth invention, an inversion amplifier unit whose drive capability can be controlled through fuse disconnection is provided on the output side of the plurality of delay elements in the means for output clock supply in the eleventh invention. As a result, the adjustment range of the delay time is further expanded and internal output clock signals whose waveforms are shaped can be obtained.

The entire disclosure of Japanese Patent Application No. 11-334078 filed on Nov. 25, 1999 including specification, claims, drawings and summary is incorporated herein by reference in its entirety.

What is claimed is:

1. A semiconductor integrated circuit, comprising:

a plurality of input terminals to which input data with a plurality of bits are provided in parallel with uniform timing;

an input clock terminal to which an input clock signal indicating timing of the input data is provided;

a plurality of input data holding circuits, each connected to respective ones of said plurality of input terminals, that hold the input data provided to said input terminals based on timing of a rise or a fall of an internal input clock signal;

an input clock distributor that distributes the input clock signal provided to said input clock terminal; and a plurality of adjustable input clock suppliers, each provided between said input clock distributor and respective ones of said input data holding circuits, that generate the internal input clock signals with uniform timing in synchronization with the input data to be provided to said input data holding circuits, by circuit elements that are selectively connectable and disconnectable to correct differences in delay time of said input clock signal occurring in different distribution routes at said input clock distributor.

2. A semiconductor integrated circuit according to claim 1, wherein said adjustable input clock suppliers each comprise a circuit correction area including the circuit elements which are serial resistors that are respectively connectable and disconnectable to correct a circuit pattern by use of a circuit correction apparatus.

3. A semiconductor integrated circuit according to claim 1, wherein said adjustable input clock suppliers each comprise:

an inversion amplifier unit that outputs a signal achieved by inverting said input clock signal provided by said input clock distributor;

a first transistor connected between a source potential and a source terminal of said inversion amplifier unit, to supply power to said inversion amplifier unit;

a second transistor and a third transistor connected between said source potential and said source terminal of said inversion amplifier unit, the supply of power to said inversion amplifier unit being controlled by said second and third transistors responsive to a first control signal and a second control signal respectively;

a fourth transistor connected between a ground potential and a ground terminal of said inversion amplifier unit, to supply power to said inversion amplifier unit;

a fifth transistor and a sixth transistor connected between said ground potential and said ground terminal of said inversion amplifier unit, the supply of power to said inversion amplifier unit also being controlled by said fifth and sixth transistors responsive to a third control signal and a fourth control signal respectively;

a first control unit having a first fuse, that outputs said first and third control signals to control said second transistor and said fifth transistor to be in an OFF state when said first fuse is not disconnected, and that outputs said first and third control signals to control said second transistor and said fifth transistor to be in an ON state when said first fuse is disconnected; and a second control unit having a second fuse, that outputs said second and fourth control signals to control said third transistor and said sixth transistor to be in an ON state when said second fuse is not disconnected, and that outputs said second and fourth control signals to control said third transistor and said sixth transistor to be in an OFF state when said second fuse is disconnected.

4. A semiconductor integrated circuit, comprising:

a plurality of input terminals to which input data with a plurality of bits are provided in parallel with uniform timing;

an input clock terminal to which an input clock signal indicating timing of the input data is provided;

a plurality of input data holding circuits, each connected to respective ones of said plurality of input terminals, that hold the input data provided to said input terminals based on timing of a rise or fall of an internal input clock signal;

an input clock distributor that distributes said input clock signal provided to said input clock terminal;

a plurality of input clock suppliers, each provided between said input clock distributor and respective ones of said input data holding circuits, that provide the internal input clock signals generated based upon said input clock signal distributed by said input clock distributor to said input data holding circuits;

a plurality of output terminals that output in parallel output data with a plurality of bits;

an output clock terminal provided with an output clock signal indicating timing with which the output data are output;

a plurality of output data holding circuits, each connected to respective ones of said plurality of output terminals, that output the output data to said output terminals based on an internal output clock signal;

an output clock distributor that distributes said output clock signal provided to said output clock terminal;

a plurality of output clock suppliers, each provided between said output clock distributor and respective ones of said output data holding circuits, that generate the internal output clock signals based upon said output clock signal distributed by said output clock distributor to be provided to said output data holding circuits; and a plurality of data loop-back circuits that each provide input data held at respective ones of said input data holding circuits to respective ones of said output data holding circuits as output data, when a test mode is specified by a mode signal that specifies either said test mode or a normal mode.

5. A semiconductor integrated circuit according to claim 4, wherein said input clock suppliers are provided with a plurality of disconnectable first delay elements to generate said internal input clock signals with uniform timing in synchronization with said input data to be provided to said input data holding circuits by correcting differences in delay time of said input clock signal occurring in different distribution routes at said input clock distributor.

6. A semiconductor integrated circuit according to claim 5, wherein said input clock suppliers each comprise:

a first inversion amplifier unit that outputs a signal achieved by inverting said input clock signal provided by said input clock distributor via said first delay elements;

a second inversion amplifier unit constituted of a pair of a first transistor and a second transistor that are complementary conductive transistors, that further inverts an output signal from said first inversion amplifier unit to generate an internal input clock signal;

a plurality of conductive third transistors identical to said first transistor, that are connected in parallel to said first transistor and are disconnectable through fuse disconnection; and a plurality of conductive fourth transistors identical to the second transistor, that are connected in parallel to the second transistor and are disconnectable through fuse disconnection.

7. A semiconductor integrated circuit according to claim 4, wherein said output clock suppliers are each provided with a plurality of disconnectable second delay elements to generate the internal output clock signals with uniform timing to be provided to said output data holding circuits by correcting differences in delay time of said output clock signal occurring in different distribution routes at said output clock distributor.

8. A semiconductor integrated circuit according to claim 7, wherein said output clock suppliers each comprise:

a third inversion amplifier unit that outputs a signal achieved by inverting said output clock signal provided by said output clock distributor via said second delay elements;

a fourth inversion amplifier unit constituted of a pair of a fifth transistor and a sixth transistor that are complementary conductive transistors, that further inverts an output signal from said third inversion amplifier unit to generate an internal output clock signal;

a plurality of conductive seventh transistors identical to said fifth transistor, that are connected in parallel to said fifth transistor and are disconnectable through fuse disconnection; and a plurality of conductive eighth transistors identical to said sixth transistor, that are connected in parallel to said sixth transistor and are disconnectable through fuse disconnection.

9. A semiconductor integrated circuit according to claim 4, further comprising a first delay circuit having a plurality of third delay elements, which are adjustable through disconnection to insert a specific phase delay, provided between said input clock terminal and said input clock distributor.

10. A semiconductor integrated circuit according to claim 9, wherein said input clock suppliers each comprise:

a fifth inversion amplifier unit that outputs a signal achieved by inverting said input clock signal provided by said input clock distributor;

a sixth inversion amplifier unit constituted of a pair of a ninth transistor and a tenth transistor that are complementary conductive transistors, that further inverts the output signal from said fifth inversion amplifier unit to generate an internal input clock signal;

a plurality of conductive eleventh transistors identical to the ninth transistor, that are connected in parallel to the ninth transistor and are disconnectable through fuse disconnection; and a plurality of conductive twelfth transistors identical to the tenth transistor, that are connected in parallel to the tenth transistor and are disconnectable through fuse disconnection.

11. A semiconductor integrated circuit according to claim 4, further comprising a second delay circuit having a plurality of fourth delay elements, which are adjustable through disconnection to insert a constant phase delay, provided between said output clock terminal and said output clock distributor.

12. A semiconductor integrated circuit according to claim 11, wherein said output clock suppliers each comprise:

a seventh inversion amplifier unit that outputs a signal achieved by inverting said output clock signal provided by said output clock distributor;

an eighth inversion amplifier unit constituted of a pair of a thirteenth transistor and a fourteenth transistor that are complementary conductive transistors, that further inverts an output signal from said seventh inversion amplifier unit to generate an internal output clock signal;

a plurality of conductive fifteenth transistors identical to said thirteenth transistor, that are connected in parallel to said thirteenth transistor and are disconnectable through fuse disconnection; and a plurality of conductive sixteenth transistors identical to said fourteenth transistor, that are connected in parallel to said fourteenth transistor and are disconnectable through fuse disconnection.

13. A semiconductor integrated circuit according to claim 1, wherein said adjustable input clock suppliers each comprise a circuit correction area including the circuit elements which are parallel capacitors that are respectively connectable and disconnectable to correct a circuit pattern by use of a circuit correction apparatus.

14. A semiconductor integrated circuit according to claim 1, wherein said adjustable input clock suppliers each comprise a circuit correction area including the circuit elements which are drive transistors that are respectively connectable and disconnectable to correct a circuit pattern by use of a circuit correction apparatus.

* * * * *